United States Patent [19]

DuBois

[11] Patent Number: 4,896,102
[45] Date of Patent: Jan. 23, 1990

[54] SPECTRUM ANALYZER

[75] Inventor: Carl E. DuBois, San Diego, Calif.

[73] Assignee: Scientific-Atlanta, Inc., Atlanta, Ga.

[21] Appl. No.: 205,915

[22] Filed: Jun. 13, 1988

[51] Int. Cl.$^4$ ............................................. G01R 23/16
[52] U.S. Cl. ................................. 324/77 B; 324/77 C
[58] Field of Search ............... 324/77 B, 77 CS, 77 C; 364/485

[56] References Cited

U.S. PATENT DOCUMENTS

| | | | |
|---|---|---|---|
| 3,808,412 | 4/1974 | Smith | 324/77 B |
| 4,054,785 | 10/1977 | Lehmann | 324/77 D |
| 4,093,989 | 6/1978 | Flink et al. | |
| 4,321,680 | 3/1982 | Bertrand et al. | |
| 4,607,216 | 8/1986 | Yamaguchi et al. | |
| 4,665,494 | 5/1987 | Tanaka et al. | |
| 4,720,674 | 1/1988 | Takeuchi et al. | 324/77 B |

OTHER PUBLICATIONS

"Scientific Atlanta 5004-16 dc to 30 MHz Signal Analysis System" Brochure.

Primary Examiner—Michael J. Tokar
Attorney, Agent, or Firm—Banner, Birch, McKie & Beckett

[57] ABSTRACT

A spectrum analyzer for analyzing an input spectrum. The analyzer includes a down converter capable of converting blocks or portions of the input spectrum to a corresponding predetermined output band of frequencies. A stepping device associated with the down converter sequentially selects portions of the input spectrum for conversion by the down converter. An A/D converter converts the output of the block converter into digital signals. A digital filter selects a predetermined frequency band from the predetermined output band of frequencies of the block converter. A processing unit effects FFT operation on data contained within the predetermined frequency band. A memory device sequentially stores the output from the processing unit.

14 Claims, 4 Drawing Sheets

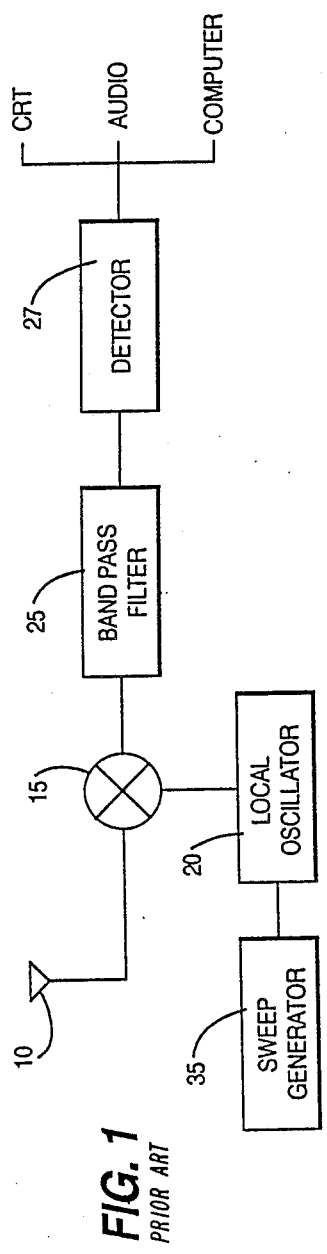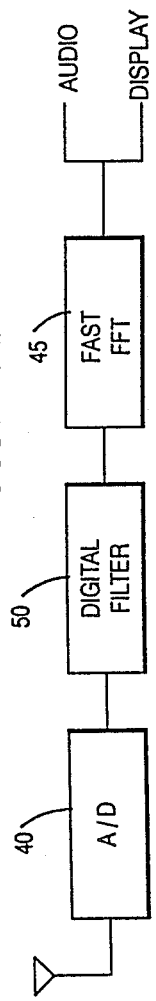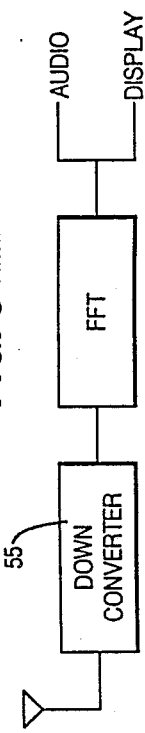
FIG. 1 PRIOR ART
FIG. 2 PRIOR ART
FIG. 3 PRIOR ART

SPECTRUM ANALYZER

BACKGROUND OF THE INVENTION

The present invention generally relates to spectrum analysis and, more particularly, to an apparatus and method for efficiently and accurately analyzing narrow bandwidths within a wide spectral range.

The analysis of signals in terms of their frequency spectrum is an important tool which is widely used to provide information related to electrical and mechanical systems. Typically, signals are analyzed in the dc-32 MHz range. This is generally the HF frequency band containing the AM band, citizen bands, etc. In engineering applications, an analyzer may be used to test the components of a system. For example, the purity of signal sources may be observed. If a radio station is restricted to broadcasting at 1 MHz, for example, and the station must maintain a certain width in their modulation levels, an analyzer may be used to monitor the station's signal. In mechanical applications, an analyzer permits monitoring of vibration components of rotating machines associated with, for example, unbalance, worn bearings, etc.

FIG. 1 illustrates an analog analyzer made in accordance with the prior art. An antenna 10 is coupled to a mixer 15 having a local oscillator 20. Oscillator 20 is coupled to a bandpass filter 25 which is in turn coupled to a detector 27 having an audio output. Similar components may be found in a radio. Detector 27 may alternatively be coupled to a CRT to display the signal or to a computer. Bandpass filter 25 permits analysis of one signal at a time. In order to produce an amplitude vs. frequency display, a spectrum analyzer includes a sweep generator 35 coupled to local oscillator 20. Sweep generator 35 rapidly tunes the local oscillator 20 through the signal band of interest. For example, in the AM radio band, the local oscillator would be tuned through frequencies from 560 KHz to 1.6 MHz. At the same time, sweep generator 35 could drive the X-axis on a CRT while detector 27 drives the Y-axis thereby producing a visual display. If, however, the bandpass filter is made narrow to resolve the frequencies which are close together, the sweep time becomes very long. If a particular signal transmission is of short duration, the wrong part of the spectrum may be being analyzed when the transmission occurs and the signal may be missed. Such a situation may occur when the analyzer is being used in surveillance operations to detect short-lived radio transmissions.

An incoming signal may also be fed directly to an A/D converter 40 as shown in FIG. 2. A/D converter 40 may be run at a 100 MHz sampling rate. A/D converter 40 is coupled to a fast FFT 45 and a display. However, present 100 MHz A/D converters are only 8-bit converters. To match the dynamic range of the system of FIG. 1, at least 10 bits are necessary. In addition, a digital filter 50 is needed if narrow resolution is required. The amount of processing thus required would have to be done "off-line" and a relatively long time period would be required to process real time displays. In short to match the frequency coverage of the prior art, a high sampling rate is required. To match the resolution, a great deal of computing is required.

FIG. 3 illustrates another prior art embodiment. FIG. 3 illustrates a down converter which received a dc-32 MHz signal and generated a 300 KHz band of data. This 300 KHz band of data was fed to a signal processor 57 to perform FFT operation. However, the circuitry required was unwiedly and only a 300 KHz band could be analyzed.

SUMMARY OF THE INVENTION

It is an object of the present invention to provide spectrum analysis of an input spectrum with the speed, resolution, and accuracy of a digital FFT calculation.

It is another object of the present invention to reduce the cost and complexity of directly digitizing and filtering an input spectrum.

In accordance with the present invention, there is provided a spectrum analyzer for analyzing an input spectrum. The analyzer includes a down converter capable of converting blocks or portions of the input spectrum to a corresponding predetermined output band of frequencies. A stepping device associated with the down converter sequentially selects portions of the input spectrum for conversion by the down converter. An A/D converter converts the output of the block converter into digital signals. A digital filter selects a predetermined frequency band from the predetermined output band of frequencies of the block converter. A processing unit effects FFT operation on data contained within the predetermined frequency band. A memory device sequentially stores the output from the processing unit.

In accordance with the present invention, there is also provided a method of analyzing an input spectrum. First, portions of the input spectrum are sequentially selected for conversion to a predetermined output band of frequencies. Next, the predetermined output band of frequencies is converted into digital signals. Then a predetermined frequency band is selected from the predetermined output band of frequencies. An FFT operation is then performed on data contained within the predetermined frequency band. Finally, the results of the FTT operation is sequentially stored in a memory device.

BRIEF DESCRIPTION OF THE DRAWINGS

A more complete appreciation of the invention and many of the attendant advantages thereof will be readily obtained as the invention becomes better understood by reference to the following detailed description when considered in connection with the accompanying drawings, wherein:

FIG. 1 illustrates a prior art analog spectrum analyzer.

FIG. 2 illustrates another embodiment of a spectrum analyzer.

FIG. 3 illustrates another prior art spectrum analyzer.

DETAILED DESCRIPTION

The object of the present invention is to provide spectrum analysis of the dc-32 MHz radio frequency spectrum with the speed, resolution, and accuracy of a digital Fast Fourier Transfrom (FFT) calculation. The cost and complexity of directly digitizing and filtering the entire radio frequency spectrum utilizing prior art techniques is prohibitive.

The present invention combines two techniques, block conversion and digital filtering, to cover the RF spectrum. The separate operations of the two signal processing sections are made invisible to the operator by automatically combining FFT processes to provide a display of the entire dc-32 MHz spectrum. With these processing blocks, further filtering may also be utilized for higher resolution analysis of any desired part of the spectrum.

The invention may be briefly summarized as follows. An analog front end of the analyzer operates as a "block converter" which down converts a block or portion of the input spectrum for digital analysis. A local oscillator is stepped to sequentially down convert adjacent bands of the input spectrum for successive FFT processing. Stepping as used herein refers to sequentially selecting blocks or portions of the input spectrum. Sequentially is generally used to refer to any predetermined order. An A/D converter digitizes the output of the block converter. A special graphics routine is used to piece successive FFTs together for display. In such a system, each FFT is optimum in converting the maximum bandwidth without requiring excessive cost. The invention essentially resides in the use of a "stepped" blocked conversion with each block converted to its spectral components by an FFT processor. The successive FFTs' are then combined for a spectral display of the complete input signal. Presently, the preferred embodiment uses 4 MHz blocks with eight stepping operations to generate a dc-32 MHz spectrum presentation, but the invention should not be understood as limited in this respect. As technology progresses, this technique can be used to cover a wider spectrum in bigger blocks.

It should be noted that while the embodiments described below are particularly concerned with the dc-32 MHz band of signals, the invention should not be viewed as limited in this respect. Those of ordinary skill in the art will be able to use the teachings off this invention to analyze wider or narrower bands.

Figure 4:
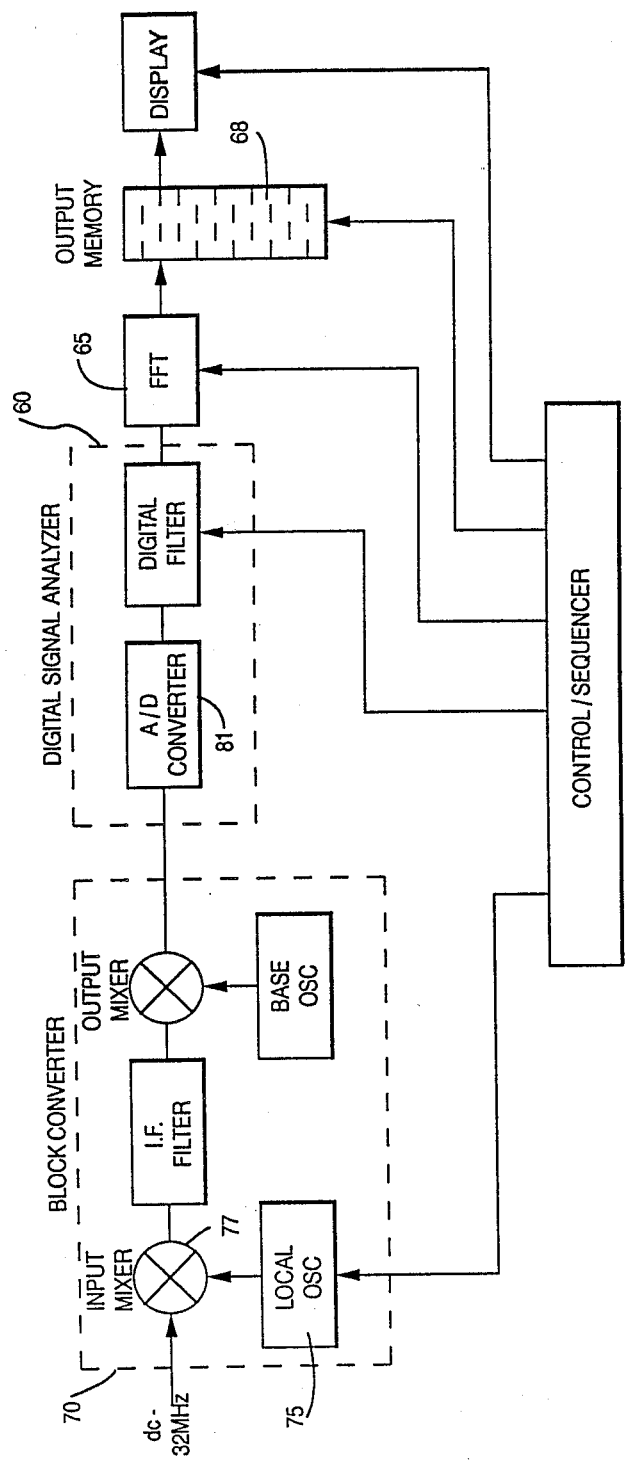
FIG. 4 illustrates a preferred embodiment of the present invention.

A preferred embodiment of the present invention is shown in FIG. 4. Digital signal analyzer 60 can take a 0-6 MHz band of signals and analyze it very quickly. The signal analyzer utilized in the preferred embodiment is a Scientific Atlanta GPB351A (351A). The 351A is essentially an A/D converter and a digital filter as illustrated in FIG. 4. However, unlike the prior art, the digital filter is moved across the spectrum in blocks rather than continuously so that the FFT can perform analysis. The 351A coupled to FFT 65 produces a spectrum which is 6 MHz wide. It is known in the art to use an FFT to analyze different portions of a spectrum and then to piece the portions together in order to obtain resolution. Signal analyzer 60 essentially functions to take any portion or all of the 6 MHz and digitize it at 15 MHz. The analyzer also prefilters the data so it can be passed to the FFt. Digital filtering is important because it permits data processing at real time rates.

A dc-32 MHz input spectrum is fed into block converter 70. Block converter 70 has a local oscillator 75 coupled to input mixer 77. Block converter 70 selects a 4 MHz portion of the original dc-32 MHz spectrum and feeds this portion into A/D converter 81 which digitizes the selected 4 MHz portion of the input spectrum.

Block converter 70 is used to present any 4 MHz section of the input spectrum and convert it to a frequency band of 2 MHz to 6 MHz (dc to 2 MHz is avoided because of IF filter shape requirements). The term "block converter" generally refers to the fact that all signals in the selected band are converted to the new output band without modifying any other spectral properties.

Local oscillator 75 is stepped. The stepping is a key feature of the invention and serves to move down converter 70 across the input band of frequencies (dc-32 MHz). Along with the stepping of local oscillator 75, the outputs of multiple FFT operations are combined to produce an entire amplitude vs. frequency spectrum. This arrangement dramatically reduces the time required to cover the dc-32 MHz spectrum. Using the prior art analog spectrum analyzer, a high resolution analysis the dc-32 MHz spectrum would take approximately 20 seconds. Utilizing the present invention, a similar scan would take 50 milliseconds.

It takes 14 milliseconds to capture a 4 MHz portion of the input spectrum. While that data is being analyzed, the next 4 MHz portion of the spectrum is being captured. Thus, in the operation of the preferred embodiment, the 0-4 MHz portion is captured and fed to the FFT. While the FFT is processing this information, local oscillator 75 is stepped and block converter 70 captures the 4-8 MHz portion of the spectrum. Next, the 8-12 MHz portion is captured. While the 8-12 MHz portion is being captured, the 4-8 MHz portion is being processed by the FFT, and the 0-4 MHz portion is being graphically displayed. Thus, the analysis of the 0-32 MHz spectrum is done in 8 different blocks and these blocks are combined to produce the full spectrum.

Various devices are known in the art to perform FFT operations. In the preferred embodiment, a Scientific Atlanta GPD350 is used to perform FFT operations.

A special purpose computer serves as the combiner to organize the different blocks of data. The computer essentially includes a memory 68 with counters. When local oscillator has been stepped so as to capture the 0-4 MHz portion of the spectrum, the associated information is stored in a first memory location. When the local oscillator has been stepped so as to capture the 4-8 MHz portion of the spectrum, the associated information is stored in a second memory location. Information is similarly stored at each "step" of the local oscillator. When the computer is instructed to display the data, the full spectrum from dc-32 MHz may be displayed by combining the data in each of the memory locations.

The advantage of this arrangement is twofold. First, the entire 0-32 MHz spectrum may be displayed to obtain a complete amplitude versus frequency display. Second, since the information is stored in these discrete memory locations, narrower bandwidths may also be viewed.

Two examples will now be given to illustrate the operations required for selected arrangements. It should be understood that these examples are for illustrative purposes only and that various modifications will be obvious to those of ordinary skill. The first example is for analysis of the entire dc-32 MHz band. With the 4 MHz (2 MHz to 6 MHz) capability of the digital translator, eight successive FFTs must be performed. The block converter will sequentially select 0-4 MHz, then 4-8 MHz, etc. to finally 28-32 MHz before repeating the sequence. The sequencer or combiner stores the successive FFT outputs so that the display may be presented as a continuous dc-32 spectrum.

The second example involves the selection of a particular portion of the spectrum, for example, 11.25 MHz to 17.25 MHz, for spectrum analysis. Again, since the portion of the spectrum to be analyzed is wider than 4 MHz, multiple FFTs must be combined to generate the complete spectrum. The desired analysis is 6 MHz wide (the differences between 17.25 MHz and 11.25 MHz) so two 4 MHz blocks are necessary although only 3 MHz is required from each block. To simplify the block converter, 1 MHz steps are used as the block boundaries. Two blocks which may be selected are 11 MHz - 15 MHz and 14 MHz-18 Mhz. The 11-15 MHz block is converted to 2-6 MHz. Thus, 11.25 MHz becomes 2.25 MHz. The digital filter then selects the 3 MHz band from 2.25 MHz to 5.25 MHz for the first FFT.

Next, the second block of 14-18 MHz is down-converted to 2 to 6 MHz. Here, 14.25 MHz corresponds to 2.25 MHz. The digital filter again selects the 3 MHz band from 2.25 to 5.25 MHz (which is the 14.25 to 17.25 MHz data) for the second FFT. Both FFT results are combined for display to present the 11.25 MHz to 17.25 MHz data as required.

Figure 5:
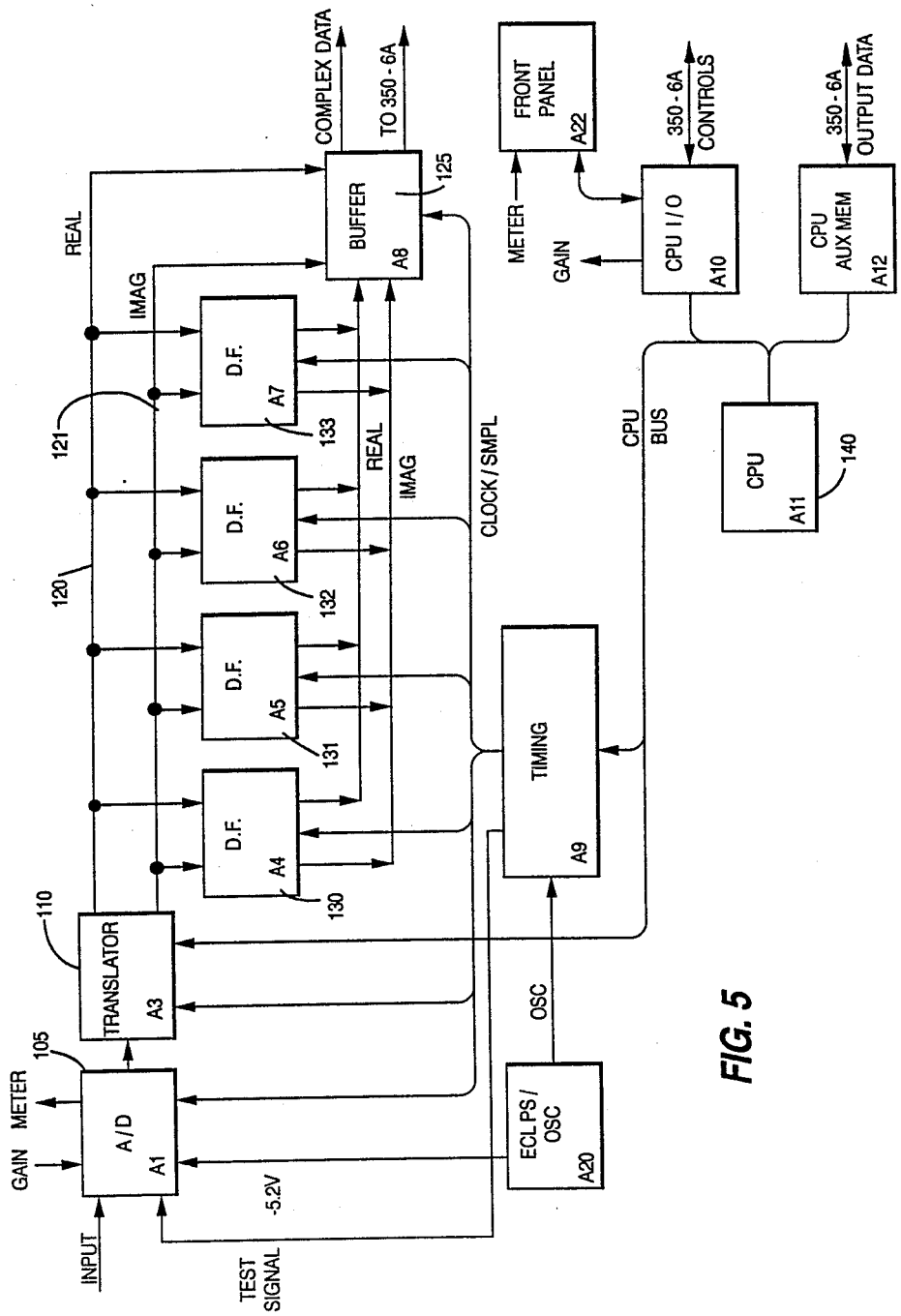
FIG. 5 is a block diagram illustrating the components of the GPD 351A.

FIG. 5 is a block diagram of the 351A. The down-converted spectrum is input to a 10 bit A/D converter 105 operated at a sample rate of 15.728664 Mhz or approximately 16 MHz. The digitized output of A/D converter 105 is input to a translator 110. Translation generally refers to the process of converting information from one system or representation into equivalent information in another system of representation. Translator 110 shifts the input spectrum by an amount equal to a translate frequency $f_t$. Translate frequency $f_t$ places the center of the desired frequency band at "dc". This process is schematically illustrated in FIG. 6.

Figure 6A:
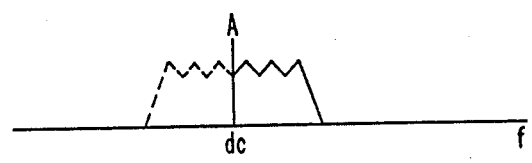
FIG. 6 shows the effect of the translator of FIG. 5.
Figure 6B:
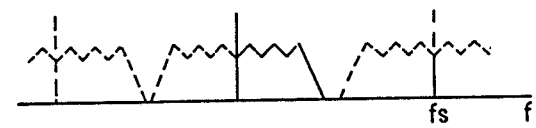
Figure 6C:
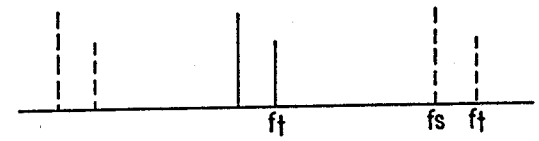
Figure 6D:
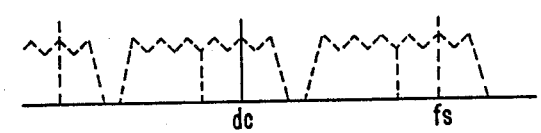

FIG. 6a shows a typical spectrum, including the negative frequency image. FIG. 6b illustrates the sampling of this spectrum. FIG. 6c represents the sampling of the translate frequency $f_t$. FIG. 6d illustrates the effect of combining the signal frequencies with $f_t$, i.e., shifting the spectrum of FIG. 6b by an amount equal to $f_t$.

The output of translator 110 consists of real data stream 120 and imaginary data stream 121. These data streams are fed into a buffer 125 directly and through digital filters 130, 131, 132, and 133. Each filter operates at one-forth the data rate and timer 125 sequentially enables the outputs to buffer 125. The 351A is controlled by CPU 140.

Figure 7A:
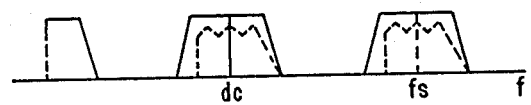
FIG. 7 shows the compacting of the spectrum of FIG. 6d.
Figure 7B:
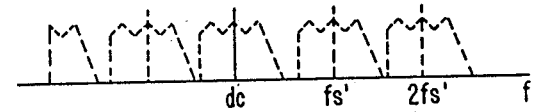

The translate frequency is the center frequency selected. It places the center of the frequency to be analyzed at dc. Since the GPD 350 performs an FFT on complex data (which produces an 800 point output spectrum from 1024 complex input points), the spectrum shown in FIG. 7d should be compacted to make the FFT more efficient. The desire is to lower the sampling frequency, but first the unneeded images must be removed. This is illustrated in FIG. 7. FIG. 7a shows the result of filtering the spectrum of FIG. 6d. FIG. 7b illustrates the result of decimating the spectrum of FIG. 7a.

Here the real data from the A/D converter, sampled at approximately 16 MHz is replaced with complex data sampled at approximately 8 MHz; no data has been lost.

The filter is shown with a negative image as it is a real filter. Real filters are used so that the real and imaginary data streams can be operated on separately and no cross terms are produced. Nine recursive filters are implemented, these filters producing an output based only on previous inputs. The reason for the filter is to band limit the data before decimation. Using the nonrecursive filters means that the filter output needs to be calculated only at the desired output sample rate.

Output sample rates implemented are integer factors of the input rate. Factors of 2, 3, 4, 5, 6, 8, 10 . . . produce output rates of 8,5.33,4,3.2,2.67,1.6 MHz. The complex FFT displays a frequency range of 80% of the sampling rate so that the produced frequency ranges for the above decimating factors are 6, 4, 3, 2.5, 1.5, 1.23 . . . . MHz. For each decimation factor, a different digital filter must be implemented.

The GPD 350 also contains a digital filter to implement its zoom feature. This filter operates up to the maximum GPD 350 sample rate of 820 KHz (320 KHz range times the 2.56 sampling ratio). Therefore, the 351A needs only to filter and decimate down to a sample rate of 820 KHz which minimizes the number of filters to be implemented.

While the foregoing description is directed to a presently preferred embodiment, it will be obvious to one of ordinary skill that various modifications may be made without departing from the true spirit or scope of the invention, which is to be limited only by the appended claims.

I claim:

1. A spectrum analyzer for analyzing an input spectrum of signals in a predetermined frequency range, said spectrum analyzer comprising:

block converter means for converting selected frequency blocks the input spectrum to a corresponding predetermined output band of frequencies, said block converter means including stepping means for sequentially selecting frequency blocks of the input spectrum for conversion by said block converter means;

A/D converter means coupled to said block converter means for converting the output of said block converter means into digital data signals;

digital filter means coupled to said A/D converter means for selecting a predetermined frequency band from the output band of frequencies of said block converter means;

processing means for processing data contained within the predetermined frequency band;

storage means for sequentially storing the output from said processing means;

display means for displaying the output stored in said storage means; and control means for controlling at least said block converter means, said processing means, and said display means such that said block converter means, said processing means, and said display means respectively and concurrently operate on sequential frequency blocks of the input spectrum.

2. A method of analyzing an input spectrum of signals in a predetermined frequency range, said method comprising the steps of:

converting sequentially selected frequency blocks of the input spectrum to a predetermined output band of frequencies;

converting the predetermined output band of frequencies into digital diata signals;

selecting a predetermined frequency band from the predetermined output band of frequencies;

processing data contained within said predetermined frequency band;

sequentially storing the processed data;

displaying the stored data; and controlling the sequential conversion of selected frequency blocks, the proccessing and the display such that sequential frequency blocks of the input spectrum are respectively and concurrently converted, processed, and displayed.

3. The spectrum analyzer in accordance with claim 1 wherein the input spectrum comprises a radio frequency spectrum.

4. The spectrum analyzer in accordance with claim 3 wherein the radio frequency spectrum comprises a dc-32 MHz spectrum.

5. The spectrum analyzer in accordance with claim 1 wherein the sequentially selected frequency blocks comprise adjacent frequency blocks.

6. The spectrum analyzer in accordance with claim 5 wherein the adjacent frequency blocks are of equal size.

7. The spectrum analyzer in accordance with claim 1 wherein said block converter means converts selected 4 MHz frequency blocks to an output band of 2 MHz to 6 MHz.

8. The method in accordance with claim 2 wherein the input spectrum comprises a radio frequency spectrum.

9. The method in accordance with claim 8 wherein the radio frequency spectrum comprises a dc-32 MHz spectrum.

10. The method in accordance with claim 2 wherein the sequentially selected frequency blocks comprise adjacent frequency blocks.

11. The method in accordance with claim 10 wherein the adjacent frequency blocks are of equal size.

12. The method in accordance with claim 2 wherein the predetermined output band of frequencies comprises 2 MHz to 6 HMz.

13. The spectrum analyzer in accordance with claim 1 wherein said processing means effects a fast Fourier Transform operation on the data.

14. The method in accordance with claim 2 wherein the step of processing the data comprises effecting a fast Fourier Transform on the data.

* * * * *